United States Patent
Pockrandt et al.

(10) Patent No.: US 6,266,274 B1
(45) Date of Patent: Jul. 24, 2001

(54) SEMICONDUCTOR MEMORY WITH NON-VOLATILE TWO-TRANSISTOR MEMORY CELLS

(75) Inventors: Wolfgang Pockrandt, Reichertshausen; Holger Sedlak, Egmating; Hans-Heinrich Viehmann, Munich, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/483,734

(22) Filed: Jan. 14, 2000

Related U.S. Application Data

(63) Continuation of application No. PCT/DE98/01970, filed on Jul. 14, 1998.

(30) Foreign Application Priority Data

Jul. 14, 1997 (DE) .............................. 197 30 116

(51) Int. Cl.[7] .................................................. G11C 16/04
(52) U.S. Cl. ............................. 365/185.17; 365/185.11; 365/185.05
(58) Field of Search .......................... 365/185.17, 185.11, 365/185.05, 185.01, 185.14, 185.23

(56) References Cited

U.S. PATENT DOCUMENTS 5,818,756 * 10/1998 Sakui et al. ..................... 365/185.17

FOREIGN PATENT DOCUMENTS

| | | |
|---|---|---|
| 19730116A1 | 1/1999 | (DE) . |
| 0317443A1 | 5/1989 | (EP) . |
| 0332274A2 | 9/1989 | (EP) . |
| 0750313A1 | 12/1996 | (EP) . |

OTHER PUBLICATIONS

Published International Application No. 96/34391 (Jungroth et al.), dated Oct. 31, 1996.

Published International Application No. 99/04399 (Pockrandt et al.), dated Jan. 28, 1999.

* cited by examiner

*Primary Examiner*—David Nelms
*Assistant Examiner*—David Lam
(74) *Attorney, Agent, or Firm*—Herbert L. Lerner; Laurence A. Greenberg; Werner H. Stemer

(57) ABSTRACT

The invention relates to a semiconductor memory having a non-volatile two-transistor memory cell which has an N-channel selection transistor and an N-channel memory transistor. The drive circuitry for the cell includes a P-channel transfer transistor. A transfer channel is connected to a row line leading to the memory cell. This enables the voltages required for programming to be obtained with relatively little technological complexity.

8 Claims, 3 Drawing Sheets

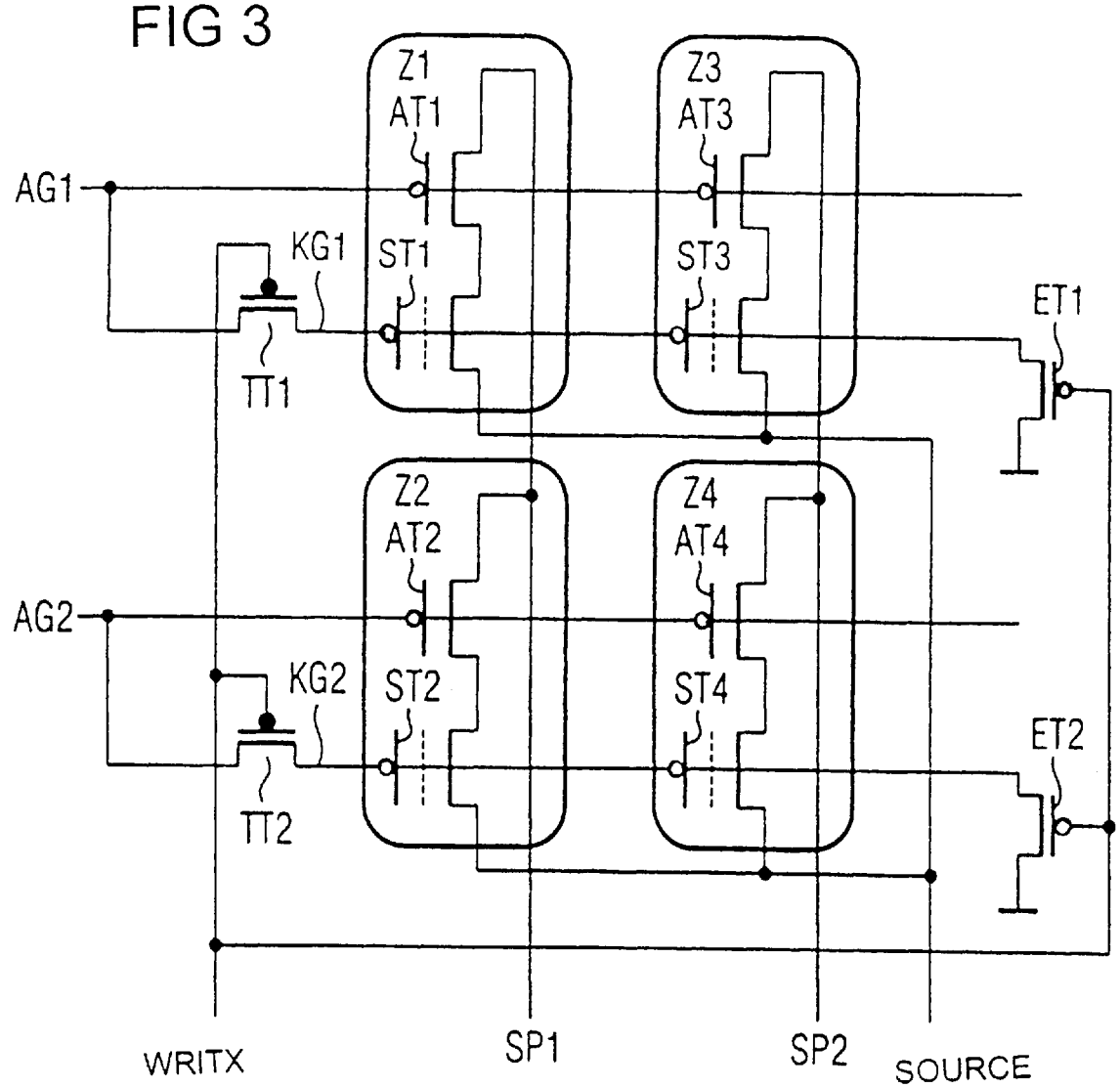

SEMICONDUCTOR MEMORY WITH NON-VOLATILE TWO-TRANSISTOR MEMORY CELLS

CROSS-REFERENCE TO RELATED APPLICATION

This is a continuation of copending International Application PCT/DE98/01970, filed Jul. 14, 1998, which designated the United States.

BACKGROUND OF THE INVENTION

Field of the Invention

The invention lies in the semiconductor technology field. More specifically, the invention relates to a semiconductor memory having at least one non-volatile, dual-transistor memory cell which has the following features:

- an N-channel selection transistor and an N-channel memory transistor;
- the N-channel selection transistor has a selection gate and two selection channels, the selection gate being connected to a row line leading to the memory cell;
- the N-channel memory transistor has a memory gate or a control gate and two memory channels;
- a second memory channel and a first selection channel are connected to one another, the other memory channel or respectively the other selection channel being connected to a column line leading to the memory cell;

whereby the semiconductor memory has at least one transfer transistor with a first and a second transfer channel, and the first transfer channel is connected to the memory gate.

In the generic semiconductor memories, the individual transistors are implemented in FET technology on a semiconductor substrate. The memory transistor thereby has a floating gate, with the result that it can be programmed, by the application of suitable voltages to the channels and to the gate, in such a way that it can assume a desired state permanently or in a non-volatile fashion.

In order to read the memory cell, a memory channel and a selection channel are connected to one another, the other free memory channel or respectively the other free selection channel being connected to a column line leading to the memory cell. In this case, the selection transistor is driven in such a way that it turns on. If a current then flows in the event of a voltage being applied to the corresponding column line, then the memory transistor has been programmed to "conducting", or written to, in a previous step. If no current flows in the event of the voltage being applied to the column line with the selection transistor turned on, then the memory transistor has been programmed to "nonconducting", or erased, in a previous step.

EP 0317 443 A1 discloses a two-transistor memory cell comprising a selection transistor and a floating gate transistor. A special voltage is applied to the gate of the floating gate transistor for driving purposes.

In the case of the memories of the generic type, the fact that the voltages required for programming have to be generated with high technological complexity is particularly problematic. Furthermore, in the course of programming one memory cell, faults are frequently produced in other memory cells which are not currently selected for programming.

SUMMARY OF THE INVENTION

The object of the invention is to provide a semiconductor memory device with non-volatile two-transistor memory cells, which overcomes the above-noted deficiencies and disadvantages of the prior art devices and methods of this kind, and which allows programming of the semiconductor memory in a fault-free manner with little technological complexity.

With the above and other objects in view there is provided, in accordance with the invention, a semiconductor memory with at least one memory cell, comprising:

- an N-channel selection transistor having a selection gate connected to the row line, a first selection channel connection connected to the column line and a second selection channel connection;
- an N-channel memory transistor having a memory gate, a first memory channel connection connected to the second selection channel connection, and a second memory channel connection;

the semiconductor memory further includes at least one P-channel transfer transistor having a first transfer channel connection connected to the memory gate and a second transfer channel connection connected to the row line leading to the memory cell.

In other words, the objects of the invention are attained by virtue of the fact that the transfer transistor is designed as a P-channel transfer transistor, the second transfer channel, unlike in the prior art, not being connected to an external control gate voltage but rather to the row line leading to the memory cell.

The invention is based on the insight that in the case of the circuits of the generic type, it is necessary to overcome a threshold voltage loss in the transfer transistor, so that higher transfer gate voltages have had to be provided. This problem can be solved by designing the transfer transistor as a transistor with a reduced threshold voltage, but this has to be bought at the expense of increased technological complexity.

With the way in which the transfer transistor is designed and connected up according to the invention, a transfer gate threshold voltage no longer needs to be overcome in order to program the memory transistor, with the result that reliable programming is possible with little technological complexity.

The invention is furthermore based on the insight that the control gate voltage "floats" in an undefined freewheel in the memory cells that are not currently being driven, on account of the particular way in which the transfer transistor is connected up in the prior art, which can lead to capacitive overcoupling of the programming voltages. Such capacitive overcoupling no longer occurs in the memory cells of the semiconductor memory according to the invention, since each memory gate is at a defined state during the programming of the semiconductor memory according to the invention.

In the system according to the invention, a logic signal converted to high voltage can be applied to the transfer gate of the transfer transistor. For this purpose, it is expedient to use a logic signal which also drives the respective programming state of the memory cell. In this case, the provision of an inverter, which is complicated to produce, for driving the transfer gate is avoided due to the design of the transfer transistor as a P-channel transfer transistor, since a P-channel transfer transistor turns off when the gate is driven, and vice-versa. In principle, however, the transfer transistor with such an inverter can also be designed as an N-channel transfer transistor.

The arrangement according to the invention makes it possible, without any losses and without further special measures, for the full programming voltage to be switched via the channel of the transfer transistor to the memory gates.

It should be understood that the invention can also be realized with a memory in which the memory and selection transistors are designed as P-channel transistors if the transfer transistor is then designed as an N-channel transistor. However, such an arrangement is more uncommon, but may afford advantages if so-called "hole conduction" is desired for the transfer of charge carriers.

In accordance with an added feature of the invention, a control line is connected to the transfer gate for driving the transfer transistor via the control line.

In accordance with an additional feature of the invention, there is provided an N-channel discharge transistor having a discharge gate connected to the control line, and a first discharge channel connection connected to the memory gate.

In accordance with another feature of the invention, the N-channel discharge transistor has a second discharge channel connection connected to ground.

In this development of the invention the drive circuit has an N-channel discharge transistor, which has a discharge gate and a first and a second discharge channel, the first discharge channel being connected to the memory gate, the second discharge channel being connected to ground, and the discharge gate being connected to that control line via which the transfer transistor is driven.

Such a discharge transistor ensures, during the programming of the memory cell, that the memory gate is at a defined potential, in particular at ground potential, during a programming operation. It is precisely when the transfer transistor is turned off that it is thereby ensured that the memory gate is at a potential of 0 V in a defined manner.

In accordance with a further feature of the invention, the at least one memory cell is one of a plurality of memory cells arranged in rows and columns, and wherein:

within the rows, the selection gates of a plurality of the memory cells are connected in parallel, and the memory gates of a plurality of memory cells are connected in parallel; and within the columns, the first memory channels and respectively the second selection channels are connected in parallel.

In accordance with again an added feature of the invention, a drive circuit of at least one of the columns has a P-channel block selection transistor with a block selection gate, a first block selection channel connection connected to the row line leading to the memory cell, and a second block selection channel connection connected to the first transfer channel connection.

In accordance with a concomitant feature of the invention, a block selection control line is connected to the block selection gates such that the block selection transistors can be driven via the block selection control line.

In other words, the semiconductor memory according to the invention is organized in rows and columns, where, within the rows, the selection gates and the memory gates of a plurality of memory cells are connected in parallel, and where, within the columns, the first memory channels and respectively the second selection channels are connected in parallel. This enables a memory according to the invention to be arranged in rows and columns in a particularly simple manner.

In this case, at least one column is provided whose drive circuit has the transfer transistor connected up according to the invention. The drive circuit may additionally have in each case a P-channel block selection transistor having a block selection gate and having two block selection channels, a first block selection channel being connected to a row line leading to a memory cell, and a second block selection channel being connected to the first transfer channel. This enables the semiconductor memory to be divided into individual blocks for programming the memory cells, which is particularly advantageous since this means that it is no longer necessary to program specific states for an entire row of the semiconductor memory, but rather only for a block selected from said row. As a result, it is also possible, in particular, to erase an individual block. For this purpose, a block selection control line is provided, which is connected to the block selection gates in such a way that the block selection transistors can be driven via the block selection control line.

The invention also generally relates to a drive circuit for driving at least one memory cell with a transfer transistor which is connected up as above.

Other features which are considered as characteristic for the invention are set forth in the appended claims.

Although the invention is illustrated and described herein as embodied in a semiconductor memory with non-volatile two-transistor memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a schematic circuit diagram of a third embodiment of the semiconductor memory according to the invention.

DESCRIPTION OF THE PREFERRED EMBODIMENTS

Figure 1:
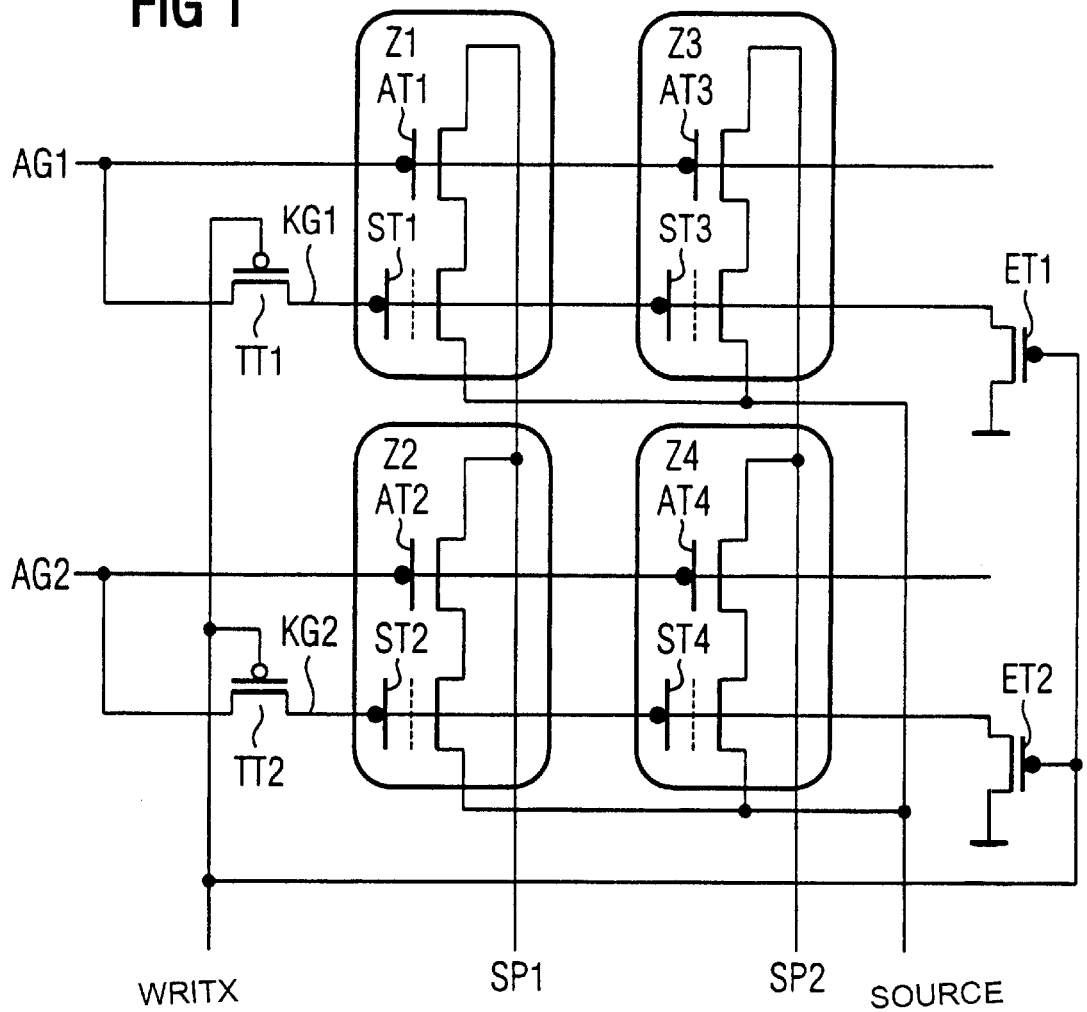
FIG. 1 is a schematic circuit diagram of a first embodiment of the semiconductor memory according to the invention.

Referring now to the figures of the drawing in detail and first, particularly, to FIG. 1 thereof, there is seen a circuit diagram of a first semiconductor memory according to the invention. The memory is implemented on a semiconductor substrate. Only a partial region of the semiconductor memory having four memory cells Z1, Z2, Z3 and Z4 is illustrated. The memory cells Z1, Z2, Z3 and Z4 can be driven via two row lines AG1, AG2 and via two column lines SP1, SP2.

In order to drive the memory cells Z1, Z2, Z3 and Z4, use is made of a drive circuit having a transfer transistor TT1, a discharge transistor ET1, a transfer transistor TT2 and a discharge transistor ET2, which are driven via a writing signal line WRITX. A signal which is converted to high voltage and is generated from a logic signal which controls the writing operation is present on the writing signal line WRITX.

The transfer transistor TT1 and the transfer transistor TT2 are produced as P-channel transistors using FET technology, whereas the discharge transistor ET1 and the discharge transistor ET2 are designed as N-channel transistors using FET technology.

The memory cell Z1 has a selection transistor AT1 and a memory transistor ST1. The selection transistor AT1 is produced as a conventional N-channel transistor using FET technology, while the memory transistor ST1 is implemented as an N-channel transistor with a so-called "floating gate". A first selection channel of the selection transistor AT1 is connected to the column line SP1, while a second selection channel of the selection transistor AT1 is connected to a first memory channel of the memory transistor ST1. A second memory channel of the memory transistor ST1 is connected to a common source line SOURCE.

A selection gate of the selection transistor AT1 is connected to the row line AG1. Likewise, a second transfer channel of the transfer transistor TT1 is connected to the row line AG1. A first transfer channel of the transfer transistor TT1 is connected to a memory gate KG1 of the memory transistor ST1. The gate of the memory transistor ST1 which is associated with the memory gate KG1 is in this case designed as a so-called "floating gate".

A transfer gate of the transfer transistor TT1 is connected to the writing signal line WRITX. A discharge gate of the discharge transistor ET1 is likewise connected to the writing signal line WRITX. A first discharge channel of the discharge transistor ET1 is connected to the memory gate KG1, while a second discharge channel of the discharge transistor ET1 is connected directly to ground.

The memory cell Z3 is connected in parallel with the memory cell Z1 with respect to the row line AG1. For this purpose, the memory cell Z3 has a selection transistor AT3, which is designed as an N-channel transistor using conventional FET technology, and a memory transistor ST3, which is designed as an N-channel transistor with a "floating gate". A first selection channel of the selection transistor AT3 is connected to the column line SP2, while a second selection channel of the selection transistor AT3 is connected to a first memory channel of the memory transistor ST3. A second memory channel of the memory transistor ST3 is connected to the common source line SOURCE. The selection gate of the selection transistor AT3 is connected in parallel with the selection gate of the selection transistor AT1 and is connected to the row line AG1.

The memory gate of the memory transistor ST3 is connected in parallel with the memory gate of the memory transistor ST1 and is connected to the second transfer channel of the transfer transistor TT1. Accordingly, the memory gate of the memory transistor ST3 is also connected to the first discharge channel of the discharge transistor ET1.

The memory cell Z2 has a selection transistor AT2 and a memory transistor ST2. The selection transistor AT2 is produced as a conventional N-channel transistor using FET technology, while the memory transistor ST2 is designed as an N-channel transistor with a so-called "floating gate". A first selection channel of the selection transistor AT2 is connected to the column line SP2, while a second selection channel of the selection transistor AT2 is connected to a first memory channel of the memory transistor ST2. A second memory channel of the memory transistor ST2 is connected to the common source line SOURCE.

A selection gate of the selection transistor AT2 is connected to the row line AG2. Likewise, a second transfer channel of the transfer transistor TT2 is connected to the row line AG2. A first transfer channel of the transfer transistor TT2 is connected to a memory gate KG2 of the memory transistor ST2. The gate of the memory transistor ST2 which is associated with the memory gate KG2 is in this case designed as a so-called "floating gate".

A transfer gate of the transfer transistor TT2 and a discharge gate of the discharge transistor ET2 are connected to the writing signal line WRITX. A first discharge channel is connected to the memory gate KG2, while a second discharge channel is connected directly to ground. The memory cell Z4 is connected in parallel with the memory cell Z2 with respect to the row line AG2. For this purpose, the memory cell Z4 has a selection transistor AT4 (implemented as an N-channel transistor using conventional FET technology) and a memory transistor ST4 (implemented as an N-channel transistor with a "floating gate"). A first selection channel of the selection transistor AT4 is connected to the column line SP2, while a second selection channel of the selection transistor AT4 is connected to a first memory channel of the memory transistor ST4. A second memory channel of the memory transistor ST4 is connected to the common source line SOURCE. The selection gate of the selection transistor AT4 is connected in parallel with the selection gate of the selection transistor AT2 and is connected to the row line AG2. The memory gate of the memory transistor ST4 is connected in parallel with the memory gate of the memory transistor ST2 and is connected to the second transfer channel of the transfer transistor TT2. Accordingly, the memory gate of the memory transistor ST4 is also connected to the first discharge channel of the discharge transistor ET2.

The memory cells Z1, Z2 are connected in parallel with respect to the column line SP1, while the memory cells Z3, Z4 are connected in parallel with respect to the column line SP2.

The three states of "erase", "write" and "read" are explained below for the memory cell Z1. In this case, no signal is applied to the column line SP1 in the "erase" state, since this is not necessary for the latter state. Only during the writing and during the reading out of the content of the memory cell Z1 is a signal applied to the column line SP1. However, this is not explained in any further detail here since this is of secondary importance for the essence of the invention.

The states of the row lines AG1, AG2, of the memory gates KG1, KG2 and of the writing signal line WRITX for the individual operating states are represented in the table below:

|  | AG1 | KG1 | AG2 | KG2 | WRITX |
|---|---|---|---|---|---|
| Erase | Up | Up | 0 | 0+Utp | 0 |
| Write | Up | 0 | 0 | 0 | Up |
| Read | U1 | U1 | 0 | 0+Utp | 0 |

In this case, the voltage "Up" designates the programming voltage (e.g. 18 V), the voltage "U1" designates a read-out voltage and the voltage "Utp" designates the positive absolute value of the threshold voltage of a p-channel transistor (approximately 1 V).

As the table clearly shows, a programming voltage Up is applied to the row line AG1 during the erasure of that row of the memory in which the memory cell Z1 is situated. As a result, the first transfer channel of the transfer transistor TT1 is likewise at the level of the programming voltage Up. The voltage 0 V is present on the writing signal line WRITX, with the result that the transfer transistor TT1 is in the turned-on state, since it is a P-channel transistor. By contrast, the discharge transistor ET1 is designed as an N-channel transistor, with the result that the signal 0 V of the writing signal line WRITX, which signal is present at the discharge gate of the discharge transistor ET1 moves the latter into a turned-off state. Consequently, the programming voltage Up is present at the memory gate KG1, which forces the "floating gate" of the memory transistor ST1 into the "erased" state.

The memory cell Z2 remains unaffected by the operations on the row line AG1 and on the writing signal line WRITX insofar as the memory gate KG2 is always in a defined state at 0 V+Utp in accordance with the potential of the row line AG2.

Since the memory cells Z3 and Z4 are connected in parallel with the memory cells Z1 and Z2 with respect to the row lines AG1, AG2, they behave in a corresponding manner to the memory cells Z1 and Z2. Therefore, in the course of the "erase" state, all those memory cells which are addressed by the row line AG1 are erased.

The memory cell Z2 and the memory cell Z4 are erased in a corresponding manner to the erasure of the memory cells Z1 and Z3.

When a value is written to the memory cell Z1, the value Up is applied to the row line AG1 and to the writing signal line WRITX. On account of the state of the writing signal line WRITX, the N-channel discharge transistor ET1 turns on, while the P-channel transfer transistor TT1 turns off. As a result, the potential of ground, namely 0 V, is present at the memory gate KG1. By the application of a suitable signal to the column line SP1, the memory transistor ST1 is written to, since the selection transistor AT1 is turned on since the signal Up is present at the selection gate.

It will be understood, in this context, that the memory cell Z2 remains unaffected by the operations in the memory cell Z1 insofar as the memory gate KG2 always maintains the defined value of 0 V in accordance with the potential of ground switched through the discharge transistor ET2.

When a value is read from the memory cell Z1, the value U1 is applied on the row line AG1, while the signal 0 is applied to the writing signal line WRITX. As a result, the memory gate KG1 is at the potential U1 in a defined manner, while the selection transistor AT1 is in the turned-on state. The state of the memory transistor ST1 can then be read out by the application of a suitable voltage to the column line SP1.

By the application of a suitable voltage to the column line SP2, in this operating mode, the memory state of the memory transistor ST3 of the memory cell Z3 can be read out, since the selection transistor AT3 is likewise in the turned-on state. The memory cells Z2 and Z4 remain unaffected by the state of the memory cells Z1 and Z3 insofar as the memory gate KG2 is always in a defined state at 0 V+Utp, since the memory gate KG2 always maintains the defined value of 0 V+Utp in accordance with the potential of ground switched through the discharge transistor ET2.

The column lines SP1 and SP2 are wired up with corresponding standard values both in the course of writing and in the course of reading.

Figure 2:
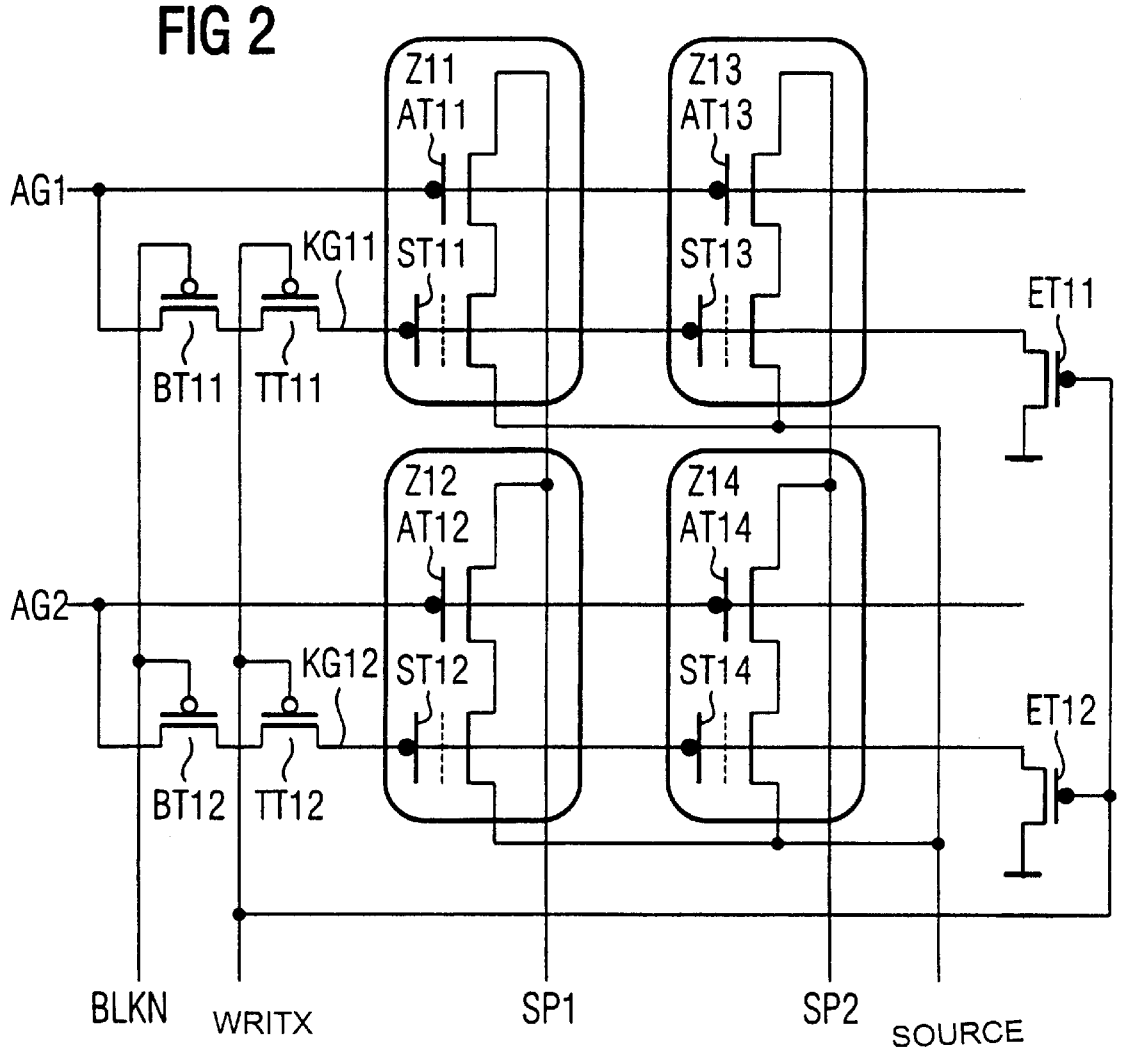
FIG. 2 is a schematic circuit diagram of a second embodiment of the semiconductor memory according to the invention.

FIG. 2 shows a circuit diagram of a further semiconductor memory according to the invention, which is designed on a semiconductor substrate. FIG. 2 illustrates only a partial region of the semiconductor memory having four memory cells Z11, Z12, Z13 and Z14. The memory cells Z11, Z12, Z13 and Z14 can be driven via two row lines AG1, AG2 and via two column lines SP1, SP2.

In order to drive the memory cells Z11, Z12, Z13 and Z14, use is made of a drive circuit having a transfer transistor TT11, a discharge transistor ET11, a transfer transistor TT12 and a discharge transistor ET12, which are driven via a writing signal line WRITX. A signal which is converted to high voltage and is generated from a logic signal which controls the writing operation is present on the writing signal line WRITX. The drive circuit furthermore comprises a block selection transistor BT11 and a block selection transistor BT12. A block selection gate of the block selection transistor BT11 and a block selection gate of the block selection transistor BT12 are connected to a block selection signal line BLKN. A signal which is converted to high voltage and is generated from a further logic signal which controls the block-by-block programming operation is present on the block selection signal line BLKN.

The transfer transistors TT11 and TT12 and the block selection transistors BT11 and BT12 are produced as conventional P-channel transistors using FET technology.

The memory cell Z11 has a selection transistor AT11 and a memory transistor ST11. The selection transistor AT11 is produced as a conventional N-channel transistor using FET technology, while the memory transistor ST11 is designed as an N-channel transistor with a so-called "floating gate". A first selection channel of the selection transistor AT11 is connected to the column line SP1, while a second selection channel of the selection transistor AT11 is connected to a first memory channel of the memory transistor ST11. A second memory channel of the memory transistor ST11 is connected to a common source line SOURCE.

A selection gate of the selection transistor AT11 is connected to the row line AG1. Likewise, a second block selection channel of the block selection transistor BT11 is connected to the row line AG1. A second transfer channel of the transfer transistors TT11 is connected to a first block selection channel of the block selection transistor BT11 and a first transfer channel of the transfer transistor TT11 is connected to a memory gate KG11 of the memory transistor ST11. The gate of the memory transistor ST11 which is associated with the memory gate KG11 is in this case designed as a so-called "floating gate". A transfer gate of the transfer transistor TT11 is connected to the writing signal line WRITX.

A discharge gate of the discharge transistor ET11 is connected to the writing signal line WRITX. A first discharge channel is connected to the memory gate KG11, while a second discharge channel is connected directly to ground.

The memory cell Z13 is connected in parallel with the memory cell Z11 with respect to the row line AG1. For this purpose, the memory cell Z13 has a selection transistor AT13, which is designed as an N-channel transistor using conventional FET technology, and a memory transistor ST13, which is designed as an N-channel transistor with a "floating gate". A first selection channel of the selection transistor AT13 is connected to the column line SP2, while a second selection channel of the selection transistor AT13 is connected to a first memory channel of the memory transistor ST13. A second memory channel of the memory transistor ST13 is connected to the common source line SOURCE. The selection gate of the selection transistor AT13 is connected in parallel with the selection gate of the selection transistor AT11 and is connected to the row line AG1. The memory gate of the memory transistor ST13 is connected in parallel with the memory gate of the memory transistor ST11 and is connected to the second transfer channel of the transfer transistor TT11. Accordingly, the memory gate of the memory transistor ST13 is also connected to the first discharge channel of the discharge transistor ET11.

The memory cell Z12 has a selection transistor AT12 and a memory transistor ST12. The selection transistor AT12 is produced as a conventional N-channel transistor using FET technology, while the memory transistor ST12 is designed as an N-channel transistor with a so-called "floating gate". A first selection channel of the selection transistor AT12 is connected to the column line SP2, while a second selection channel of the selection transistor AT12 is connected to a first memory channel of the memory transistor ST12. A second memory channel of the memory transistor ST12 is connected to the common source line SOURCE.

A selection gate of the selection transistor AT12 is connected to the row line AG2. Likewise, a second block selection channel of the block selection transistor BT12 is connected to the row line AG2. A second transfer channel of the transfer transistor TT12 is connected to a first block selection channel of the block selection transistor BT12 and a first transfer channel of the transfer transistor TT12 is connected to a memory gate KG12 of the memory transistor ST12. The gate of the memory transistor ST12 which is associated with the memory gate KG12 is in this case designed as a so-called "floating gate".

A transfer gate of the transfer transistor TT12 is connected to the writing signal line WRITX. A block selection gate of the block selection transistor BT12 is connected to the block selection signal line BLKN.

A discharge gate of the discharge transistor ET12 is connected to the writing signal line WRITX. A first discharge channel is connected to the memory gate KG12, while a second discharge channel is connected directly to ground.

The memory cell Z14 is connected in parallel with the memory cell Z12 with respect to the row line AG2. For this purpose, the memory cell Z14 has a selection transistor AT14, which is designed as an N-channel transistor using conventional FET technology, and a memory transistor ST14, which is designed as an N-channel transistor with a "floating gate". A first selection channel of the selection transistor AT14 is connected to the column line SP2, while a second selection channel of the selection transistor AT14 is connected to a first memory channel of the memory transistor ST14. A second memory channel of the memory transistor ST14 is connected to the common source line SOURCE. The selection gate of the selection transistor AT14 is connected in parallel with the selection gate of the selection transistor AT12 and is connected to the row line AG2. The memory gate of the memory transistor ST14 is connected in parallel with the memory gate of the memory transistor ST12 and is connected to the second transfer channel of the transfer transistor TT12. Accordingly, the memory gate of the memory transistor ST14 is also connected to the first discharge channel of the discharge transistor ET12.

The memory cells Z11, Z12 are connected in parallel with respect to the column line SP1. The memory cells Z13, Z14 are connected in parallel with respect to the column line SP2.

The three states of "erase", "write" and "read" are explained below for the memory cell Z11. In this case, no signal is applied to the column line SP1 in the "erase" state, since this is not necessary for the latter state. Only during the writing and during the reading out of the content of the memory cell Z11 is a signal applied to the column line SP1. However, this is not explained in any further detail here since this is of secondary importance for the essence of the invention.

The states of the row lines AG1, AG2, of the memory gates KG11, KG12 and of the writing signal line WRITX for the individual operating states are represented in the table below:

|       | AG1 | KG11 | AG2 | KG12  | WRITX |
|-------|-----|------|-----|-------|-------|
| Erase | Up  | Up   | 0   | 0+Utp | 0     |
| Write | Up  | 0    | 0   | 0     | Up    |
| Read  | U1  | U1   | 0   | 0+Utp | 0     |

The block selection signal BLKN assumes the voltages 0 V ("selected") or Up ("not selected"), depending on whether or not the block of the semiconductor memory in which the memory cells Z1 to Z4 are situated is selected.

In this case, the voltage "Up" designates the programming voltage (e.g. 18 V), the voltage "U1" designates a read-out voltage and the voltage "Utp" designates the positive absolute value of the threshold voltage of a p-channel transistor (approximately 1 V).

For the description below of the method of operation of the semiconductor memory, it is assumed that the signal BLKN is always at 0 V, with the result that the channels of the block selection transistors are in the turned-on state and forward the signals on the row lines to the channels of the transfer transistors TT11 and TT12.

As the table clearly shows, a programming voltage Up is applied to the row line AG1 during the erasure of that row of the memory in which the memory cell Z11 is situated. As a result, the first transfer channel of the transfer transistor TT11 is likewise at the level of the programming voltage Up. The voltage 0 V is present on the writing signal line WRITX, with the result that the transfer transistor TT11 is in the turned-on state, since it is designed as a P-channel transistor. By contrast, the discharge transistor ET11 is designed as an N-channel transistor, with the result that the signal 0 V of the writing signal line WRITX, which signal is present at the discharge gate of the discharge transistor ET11, moves the latter into a turned-off state. Consequently, the programming voltage Up is present at the memory gate KG11, which forces the "floating gate" of the memory transistor ST11 into the "erased" state.

The memory cell Z12 remains unaffected by the operations on the row line AG1 and on the writing signal line WRITX insofar as the memory gate KG12 is always in a defined state at 0 V+Utp in accordance with the potential of the row line AG2.

Since the memory cells Z13 and Z14 are connected in parallel with the memory cells Z11 and Z12 with respect to the row lines AG1, AG2, they behave in a corresponding manner to said memory cells Z11 and Z12. Therefore, in the course of the "erasure" state, all those memory cells which are addressed by the row line AG1 are erased.

The memory cell Z12 and the memory cell Z14 are erased in a corresponding manner to the erasure of the memory cells Z11 and Z13. When a value is written to the memory cell Z11, the value Up is applied to the row line AG1 and to the writing signal line WRITX. On account of the state of the writing signal line WRITX, the N-channel discharge transistor ET11 turns on, while the P-channel transfer transistor TT11 turns off. As a result, the potential of ground, namely 0 V, is present at the memory gate KG11. By the application of a suitable signal to the column line SP1, the memory transistor ST11 is written to, since the selection transistor AT11 is turned on on account of the signal Up present at the selection gate. In this case, it should be noted that the memory cell Z12 remains unaffected by the operations in the memory cell Z11 insofar as the memory gate KG12 always maintains the defined value of 0 V in accordance with the potential of ground switched through the discharge transistor. When a value is read from the memory cell Z11, the value U1 is applied on the row line AG1, while the signal 0 is applied to the writing signal line WRITX. As a result, the memory gate KG11 is at the potential U1 in a defined manner, while the selection transistor AT11 is in the turned-on state.

The state of the memory transistor ST11 can then be read out by the application of a suitable voltage to the column line SP1. By the application of a suitable voltage to the column line SP2, in this operating mode, the memory state of the memory transistor ST13 of the memory cell Z13 can be read out, since the selection transistor AT13 is likewise in the turned-on state. The memory cells Z12 and Z14 remain unaffected by the state of the memory cells Z11 and Z13 insofar as the memory gate KG12 is always in a defined state at 0 V+Utp, to be precise on account of the ground switched through the discharge transistor. The column lines SP1 and SP2 are wired up with the corresponding standard values both in the course of writing and in the course of reading.

FIG. 3 shows a third embodiment that is similar to the first embodiment except that the memory transistors ST1–ST4 and the selection transistors AT1–AT4 are designed as P-channel transistors and the transfer transistors are designed as an N-channel transistors. Such an arrangement is uncommon, but may afford advantages if so-called "hole conduction" is desired for the transfer of charge carriers.

We claim:

1. A semiconductor memory, comprising:
   a row line and a column line;
   at least one memory cell formed of
      an N-channel selection transistor having a selection gate connected to said row line, a first selection channel connection connected to said column line and a second selection channel connection;
      an N-channel memory transistor having a memory gate, a first memory channel connection connected to said second selection channel connection, and a second memory channel connection;
   at least one P-channel transfer transistor having a first transfer channel connection connected to said memory gate and a second transfer channel connection connected to said row line leading to said memory cell.

2. The semiconductor memory according to claim 1, wherein said transfer transistor includes a transfer gate, and which further comprises a control line connected to said transfer gate for driving said transfer transistor via said control line.

3. The semiconductor memory according to claim 2, which further comprises an N-channel discharge transistor having a discharge gate connected to said control line, and a first discharge channel connection connected to said memory gate.

4. The semiconductor memory according to claim 3, wherein said N-channel discharge transistor has a second discharge channel connection connected to ground.

5. The semiconductor memory according to claim 1, wherein said at least one memory cell is one of a plurality of memory cells arranged in rows and columns, and wherein:
   within the rows, said selection gates of a plurality of said memory cells are connected in parallel, and said memory gates of a plurality of memory cells are connected in parallel; and
   within the columns, said first memory channels and respectively said second selection channels are connected in parallel.

6. The semiconductor memory according to claim 5, which comprises a drive circuit of at least one of said columns having a P-channel block selection transistor with a block selection gate, a first block selection channel connection connected to said row line leading to said memory cell, and a second block selection channel connection connected to said first transfer channel connection.

7. The semiconductor memory according to claim 6, which comprises a block selection control line connected to said block selection gates such that said block selection transistors can be driven via said block selection control line.

8. A semiconductor memory, comprising:
   a row line and a column line;
   at least one memory cell formed of
      a P-channel selection transistor having a selection gate connected to said row line, a first selection channel connection connected to said column line and a second selection channel connection;
      a P-channel memory transistor having a memory gate, a first memory channel connection connected to said second selection channel connection, and a second memory channel connection;
   at least one N-channel transfer transistor having a first transfer channel connection connected to said memory gate and a second transfer channel connection connected to said row line leading to said memory cell.

* * * * *